(12) United States Patent
Luo

(10) Patent No.: US 11,342,541 B2
(45) Date of Patent: May 24, 2022

(54) METHOD OF FABRICATING LIGHT EMITTING DISPLAY PANEL USING SOLVENT VAPOR COMPENSATION RESERVOIR

(71) Applicant: BOE Technology Group Co., Ltd., Beijing (CN)

(72) Inventor: Chengyuan Luo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 650 days.

(21) Appl. No.: 16/332,502

(22) PCT Filed: Oct. 25, 2018

(86) PCT No.: PCT/CN2018/111848
§ 371 (c)(1),
(2) Date: Mar. 12, 2019

(87) PCT Pub. No.: WO2019/085818
PCT Pub. Date: May 9, 2019

(65) Prior Publication Data
US 2021/0376297 A1    Dec. 2, 2021

(30) Foreign Application Priority Data
Oct. 31, 2017  (CN) .......................... 201711048111.X

(51) Int. Cl.
*H01L 21/00*  (2006.01)
*H01L 51/56*  (2006.01)
*H01L 27/32*  (2006.01)

(52) U.S. Cl.
CPC .......... *H01L 51/56* (2013.01); *H01L 27/3223* (2013.01); *H01L 27/3246* (2013.01); *H01L 27/3283* (2013.01)

(58) Field of Classification Search
CPC ....................................................... H01L 51/56
See application file for complete search history.

(56) References Cited

U.S. PATENT DOCUMENTS

| 2009/0232970 A1* | 9/2009 | Kidu ................... H01L 51/0005 427/66 |
| 2011/0233572 A1* | 9/2011 | Nakatani ............. H01L 51/5228 257/88 |

(Continued)

*Primary Examiner* — Caleb E Henry
(74) *Attorney, Agent, or Firm* — Intellectual Valley Law, P.C.

(57) ABSTRACT

A method of fabricating a light emitting display panel. The method includes providing a substrate having a display area and a peripheral area, the substrate including a pixel definition layer for defining a plurality of subpixel apertures for a light emitting layer in the display area; attaching a solvent vapor compensation reservoir to the peripheral area of the substrate, the solvent vapor compensation reservoir having one or more ink droplet receiving grooves configured to receive an ink droplet and a connection layer, the solvent vapor compensation reservoir removably attached to the peripheral area of the substrate through the connection layer; dispensing ink droplets into the plurality of subpixel apertures and the one or more ink droplet receiving grooves; drying the ink droplets dispensed into the plurality of subpixel apertures and the one or more ink droplet receiving grooves; and removing the solvent vapor compensation reservoir from the substrate.

11 Claims, 5 Drawing Sheets

(56) References Cited

U.S. PATENT DOCUMENTS

2012/0299989 A1* 11/2012 Prothon ............... B41J 2/17596
  347/6
2017/0047381 A1* 2/2017 Takata ................ H01L 27/3246
2018/0233296 A1* 8/2018 Yan .................... H01L 51/0002
2018/0354269 A1* 12/2018 Smith .................. B41J 2/17546

* cited by examiner

METHOD OF FABRICATING LIGHT EMITTING DISPLAY PANEL USING SOLVENT VAPOR COMPENSATION RESERVOIR

CROSS-REFERENCE TO RELATED APPLICATION

This application is a national stage application under 35 U.S.C. § 371 of International Application No. PCT/CN2018/111848, filed Oct. 25, 2018, which claims priority to Chinese Patent Application No. 201711048111.X, filed Oct. 31, 2017, the contents of which are incorporated by reference in the entirety.

TECHNICAL FIELD

The present invention relates to display technology, more particularly, to a substrate for a light emitting display panel having a display area and a peripheral area, a method of fabricating a light emitting display panel, a solvent vapor compensation reservoir for fabricating a substrate for a light emitting display panel, and a display apparatus.

BACKGROUND

The organic light emitting diode (OLED) is a new display technology having promising prospect, because of its advantages such as high response, high contrast, and flexibility. Among the methods of fabricating organic thin film of OLED devices, inkjet printing is considered an important method to mass produce large-size OLED devices.

SUMMARY

In one aspect, the present invention provides a method of fabricating a light emitting display panel, comprising providing a substrate having a display area and a peripheral area, the substrate comprising a pixel definition layer for defining a plurality of subpixel apertures for a light emitting layer in the display area; attaching a solvent vapor compensation reservoir to the peripheral area of the substrate, the solvent vapor compensation reservoir comprising one or more ink droplet receiving grooves configured to receive an ink droplet and a connection layer, the solvent vapor compensation reservoir removably attached to the peripheral area of the substrate through the connection layer, dispensing ink droplets into the plurality of subpixel apertures and the one or more ink droplet receiving grooves; drying the ink droplets dispensed into the plurality of subpixel apertures and the one or more ink droplet receiving grooves; and removing the solvent vapor compensation reservoir from the substrate.

Optionally, the connection layer comprises an adhesive material layer.

Optionally, the adhesive material layer comprises one or a combination of a thermally removable adhesive, a magnetic particle-dispersed adhesive, and a gecko biomimetic adhesive.

Optionally, prior to attaching the solvent vapor compensation reservoir to the peripheral area of the substrate, the method further comprises providing a molding substrate having one or more grooves; filling the one or more grooves with a molding material and curing the molding material filled in the one or more grooves, thereby forming a solvent vapor compensation reservoir having one or more ink droplet receiving grooves; forming a connection layer on the solvent vapor compensation reservoir; adhering the connection layer onto the peripheral area of the substrate; and separating the solvent vapor compensation reservoir from the molding substrate, thereby attaching the solvent vapor compensation reservoir to the peripheral area of the substrate.

Optionally, the connection layer comprises an adhesive material layer including a thermally removable adhesive; wherein removing the solvent vapor compensation reservoir from the substrate comprises heating the adhesive material layer.

Optionally, the connection layer comprises an adhesive material layer including a magnetic particle-dispersed adhesive; wherein removing the solvent vapor compensation reservoir from the substrate comprises applying a magnetic field to the adhesive material layer.

Optionally, the connection layer comprises a gecko biomimetic adhesive; wherein removing the solvent vapor compensation reservoir from the substrate comprises applying a first force to the connection layer along a direction perpendicular to the substrate; and applying a second force to the connection layer along a direction parallel to the substrate.

Optionally, a depth of each of one or more ink droplet receiving grooves equals to the depth of each of the plurality of subpixels apertures in the display area.

Optionally, a depth of each of one or more ink droplet receiving grooves is greater than the depth of each of the plurality of subpixels apertures in the display area.

Optionally, each of one or more ink droplet receiving grooves extends through the solvent vapor compensation reservoir; and the connection layer constitutes a bottom surface for each of the one or more ink droplet receiving grooves.

In another aspect, the present invention provides a substrate for a light emitting display panel having a display area and a peripheral area, comprising a pixel definition layer for defining a plurality of subpixel apertures for a light emitting layer in the display area; and a solvent vapor compensation reservoir in the peripheral area; wherein the solvent vapor compensation reservoir comprises one or more ink droplet receiving grooves configured to receive an ink droplet, and a connection layer removably attached to the peripheral area of the substrate.

Optionally, the connection layer comprises an adhesive material layer.

Optionally, the adhesive material layer comprises one or a combination of a thermally removable adhesive, a magnetic particle-dispersed adhesive, and a gecko biomimetic adhesive.

Optionally, the one or more ink droplet receiving grooves is made of a molding material.

Optionally, the solvent vapor compensation reservoir is disposed at a position abutting a periphery of the display area.

Optionally, each of the one or more ink droplet receiving grooves has an aperture having a size substantially same as a size of each of the plurality of subpixel apertures.

Optionally, the one or more ink droplet receiving grooves are arranged in a repeating pattern having a first pitch; the plurality of subpixel apertures are arranged in a repeating pattern having a second pitch; and the first pitch and the second pitch are substantially same.

In another aspect, the present invention provides a solvent vapor compensation reservoir for fabricating a substrate for a light emitting display panel, comprising one or more ink droplet receiving grooves configured to receive an ink droplet on a first side; and a connection layer on a second side opposite to the first side; wherein the connection layer is configured to be removably attached to a peripheral area of the substrate.

In another aspect, the present invention provides a display apparatus comprising the substrate described herein or fabricated by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In the process of fabricating an OLED display panel using inkjet printing, ink droplets are dispensed in each subpixel of display area of a substrate. Subsequent to inkjet printing, a drying process is performed on the substrate to dry the ink droplets thereby forming an organic thin film in each subpixel of display area of a substrate. However, during the drying process, the ink droplets in the subpixels in the edge portion of the substrate volatilize faster than the ink droplets do in the subpixels in the central portion of the substrate, which may lead to the difference in performance between the portion of the organic thin film formed in the edge portion of the substrate and the portion of the organic thin film formed in the central portion of the substrate, therefore, the different performances may further affect image display in different portions of the substrate.

Accordingly, the present disclosure provides, inter alia, a substrate for a light emitting display panel having a display area and a peripheral area, a method of fabricating a light emitting display panel, a solvent vapor compensation reservoir for fabricating a substrate for a light emitting display panel, and a display apparatus that substantially obviate one or more of the problems due to limitations and disadvantages of the related art. In one aspect, the present disclosure provides a substrate for a light emitting display panel having a display area and a peripheral area. In some embodiments, the substrate includes a pixel definition layer for defining a plurality of subpixel apertures for a light emitting layer in the display area; and a solvent vapor compensation reservoir in the peripheral area. Optionally, the solvent vapor compensation reservoir includes one or more ink droplet receiving grooves configured to receive an ink droplet, and a connection layer removably attached to the peripheral area of the substrate. As used herein the term "peripheral area" refers to an area where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display areas.

Figure 1:
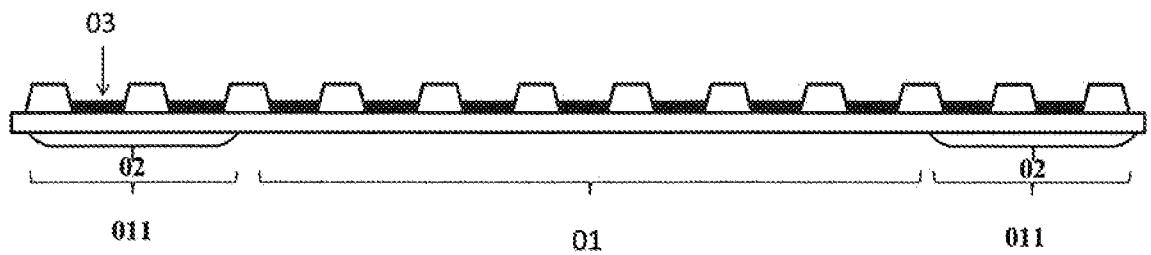
FIG. 1 is a schematic diagram of a substrate for a light emitting display panel having a dummy area.

FIG. 1 is a schematic diagram of a substrate for a light emitting display panel having a dummy area. Referring to FIG. 1, a substrate for a light emitting display panel having a display area 01 and a peripheral area 011. A pixel definition layer for defining a plurality of subpixel apertures for a light emitting layer is disposed on the display area 01. In order to solve the problem that ink droplets in different portions of a substrate have different speeds of volatilization, the peripheral area 011 includes a dummy area 02. A plurality of subpixel apertures having the same shape as the plurality of subpixel apertures in the display area 01 are disposed in the dummy area 02. During inkjet printing, ink droplets 03 are dispensed in the plurality of subpixel apertures in the display area 01 and the plurality of subpixel apertures in the dummy area 02. The organic solvent in the ink droplets in the plurality of subpixel apertures in the dummy area 02 is volatized, and the volatized organic solvent may compensate the organic solvent vapor of the plurality of subpixel apertures in the edge of display area 01, which may slow the volatilization speed of the ink droplets in the plurality of subpixels in the edge of display area 01, therefore the volatilization speeds of different portions of display area 01 of the substrate may be kept substantially same. As used herein, the term "substantially same" refers to a difference between two values not exceeding 10%, e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%.

However, because the dummy area 01 is in the peripheral area 011, the presence of the dummy area 01 will inevitably increase the area of the peripheral area 011. Having a peripheral area 011 with an increased area makes it more difficult to fabricate a narrow frame display panel.

Light emitting elements in various appropriate display panels may be fabricated by inkjet printing one or more layers of the light emitting elements (e.g., a light emitting layer, an anode, a cathode, and various other organic layers). For example, light emitting elements of an organic light emitting diode display panel and a quantum dots display panel may be fabricated by inkjet printing. The issue that ink droplets in different portions of a substrate have different speeds of volatilization exists in fabrication of various display panel. In one example, in the process of fabricating a quantum dots display panel using inkjet printing, the organic solvent having quantum dots material is dispensed in a substrate, during the drying process, the ink droplets in different portions of a substrate have different speeds of volatilization. The same problem that ink droplets in different portions of a substrate have different speeds of volatilization also occurs in other fabrication processes such as screen printing. The methods and apparatuses according to the present disclosure obviates this issue in fabricating any display panel using a method utilizing a solvent, e.g., to form subpixels on a substrate.

Figure 2:
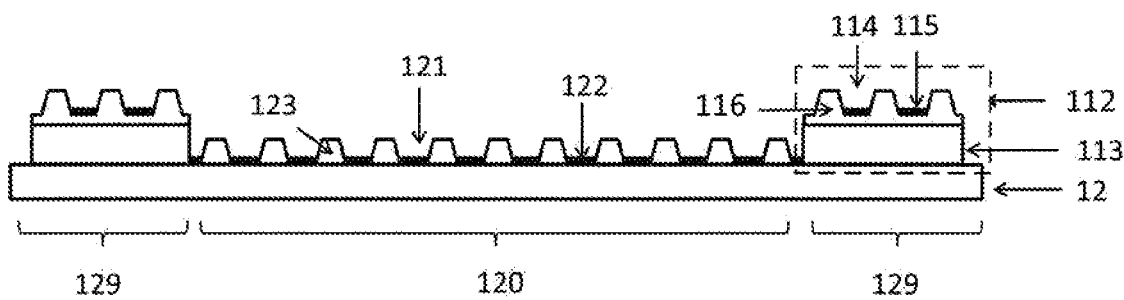
FIG. 2 is a schematic diagram illustrating the structure of a substrate for a light emitting display panel.

FIG. 2 is a schematic diagram illustrating the structure of a substrate for a light emitting display panel. Referring to FIG. 2, a substrate 12 for a light emitting display panel has a display area 120 and a peripheral area 129. The substrate 12 includes a pixel definition layer 123 for defining a plurality of subpixel apertures 121 in the display area 120, and a solvent vapor compensation reservoir 112 in the peripheral area 129. Optionally, each individual one of the plurality of subpixel apertures 121 corresponds to a respective one subpixel on the substrate 12. Optionally, the solvent vapor compensation reservoir 112 is disposed at a position abutting a periphery of the display area, and the solvent of the solvent vapor compensation reservoir 112 is used to compensate the solvent vapor from an edge portion of the display area 120. Optionally, the solvent vapor compensation reservoir 112 includes a groove layer 116 including one or more ink droplet receiving grooves 114 configured to receive an ink droplet. Optionally, the solvent vapor compensation reservoir 112 further includes a connection layer 113 removably attached to the peripheral area 129 of the substrate 12. Optionally, the connection layer 113 includes an adhesive material layer configured to removably attach the solvent vapor compensation reservoir 112 to the substrate 12. Optionally, subsequent to inkjet printing, a first organic thin film 122 are disposed in each of the plurality of subpixel apertures 121 in the display area 120. Optionally, subsequent to inkjet printing, a second organic thin film 115 are disposed in each of one or more ink droplet receiving grooves 114. Optionally, the first organic thin film 122 and the second organic thin film 115 form a light emitting layer for a display device such as an OLED device, a quantum dot display device.

Various appropriate material and various appropriate fabricating methods may be used for making the first organic thin films 122 and the second organic thin films 115. Examples of fabricating methods of the first organic thin films 122 and the second organic thin films 115 include, but not limited to, inkjet printing, screen printing and using other solvents to form organic thin films.

In some embodiments, ink droplets are dispensed in each of the plurality of subpixel apertures 121 in the display area 120, and ink droplets are dispensed in each of one or more ink droplet receiving grooves 114 of the solvent vapor compensation reservoir 112. Optionally, ink droplets are droplets having a solvent and an organic material (e.g., an organic ink material) dissolved in the solvent. Subsequent to dispensing ink droplets, a drying process is performed. The organic solvent volatilized from the ink droplets in each of one or more ink droplet receiving grooves 114 of the solvent vapor compensation reservoir 112 compensates the solvent vapor from the edge portion of the display area 120 of the substrate 12. Therefore, the solvent evaporation rate of the ink droplets in the edge portion of the display area 120 of the substrate 12 is decreased, and the solvent evaporation rate of the ink droplets in the edge portion of the display area 120 can be maintained substantially same as the solvent evaporation rate of the ink droplets in the central portion of the display area 120.

Subsequent to the inkjet printing process and drying process, the solvent vapor compensation reservoir 112 is removed. Optionally, a force is applied to the solvent vapor compensation reservoir 112, therefore, the connection layer 113 is detached from the peripheral area 129 of the substrate 12, and the solvent vapor compensation reservoir 112 is thereby removed from the peripheral area 129 of the substrate 12. Because the solvent vapor compensation reservoir 112 can be removed after the organic thin film is formed using inkjet printing, the solvent vapor compensation reservoir 112 will not continue to occupy the peripheral area 129. In all, the solvent vapor compensation reservoir 112 not only makes sure that solvent evaporation rate of the ink droplets in the edge portion of the display area 120 is substantially same as the solvent evaporation rate of the ink droplets in the central portion of the display area 120, and the solvent vapor compensation reservoir 112 can also be used in fabricating narrow frame display panel.

Various appropriate materials and various appropriate fabricating methods may be used for making the groove layer 116. Examples of material suitable for making the groove layer 116 include, but not limited to, resins, plastics, and rubber. Examples of fabricating method for making the groove layer 116 include, but not limited to, three-dimensional printing, printing, molding, and photolithography. Optionally, the groove layer 116 is made of resin, and the molding process using resin is compatible with the fabricating method of a display panel, therefore, no extra equipment is needed to perform both the molding process and the display panel fabricating process, which reduce the cost for fabricating the display panel.

In some embodiments, the depth of each of one or more ink droplet receiving grooves 114 of the solvent vapor compensation reservoir 112 can be adjusted as needed. Optionally, the depth of each of one or more ink droplet receiving grooves 114 equals to the depth of each of the plurality of subpixel apertures 121 in the display area 120. Optionally, the depth of each of one or more ink droplet receiving grooves 114 is greater than the depth of each of the plurality of subpixel apertures 121. Optionally, the depth of each of one or more ink droplet receiving grooves 114 equals to the depth of the groove layer 116. Optionally, a plurality of vias are formed extending through groove layer 116 along a direction perpendicular to the substrate 12, therefore each of one or more ink droplet receiving grooves 114 is formed by each of the plurality of vias and another layer on a side of the groove layer 116 facing the substrate 12. In one example, the connection layer 113 is on a side of the groove layer 116 facing the substrate 12, therefore, each of one or more ink droplet receiving grooves 114 is respectively formed by each of the plurality of vias on the groove layer 116 and the connection layer 113.

In some embodiments, the connection layer 113 is configured to removably attach the solvent vapor compensation reservoir 112 to the peripheral area 129 of the substrate 12. Optionally, the connection layer 113 includes an adhesive material layer. Various appropriate materials may be used for making the adhesive material layer. Examples of material suitable for making the adhesive material layer include, but not limited to, various resins and various polymers. Different materials are chosen according to different requirements for sticky levels or different temperatures. Optionally, the connection layer 113 includes a magnetic particle-dispersed adhesive material layer. One side of the connection layer 113 is fixed onto a side the groove layer 116 facing the substrate. The other side of the connection layer 113 is disposed on a side of the substrate 12 facing the solvent vapor compensation reservoir 112 by applying a magnetic field to the adhesive material layer. In one example, the magnetic field is applied from a side of the substrate 12 facing away the solvent vapor compensation reservoir 112 to the connection layer 113, thereby attracting the magnetic particle-dispersed adhesive material layer of the connection layer 113 to the substrate 12. Optionally, the connection layer 113 includes an electrostatic adsorption layer. The electrostatic adsorption layer is on one side of the connection layer 113. The other side of the connection layer 113 without the electrostatic adsorption layer is fixed to a side of the groove layer 116 facing the substrate. Therefore, using the electrostatic adsorption, the connection layer 113 removable attached the solvent vapor compensation reservoir 112 to the substrate 12. Optionally, the connection layer 113 can mechanically attach the solvent vapor compensation reservoir 112 to the substrate 12. In one example, a side of the connection layer 113 facing the substrate 12 includes buckle structures, and a side of the substrate 12 facing the connection layer 113 includes respective buckle structures. The buckle structures on the connection layer 113 and the buckle structures on the substrate 12 can respectively connect together, and can easily be separated, therefore, the solvent vapor compensation reservoir 112 is removably attached to the substrate 12.

Figure 3:
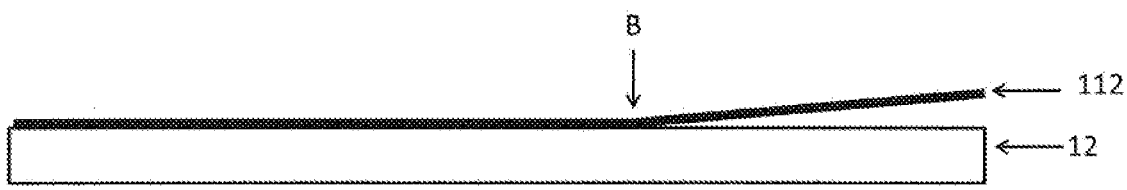
FIG. 3 is a schematic diagram illustrating the structure of a substrate for a light emitting display panel having solvent vapor compensation reservoirs removed.

FIG. 3 is a schematic diagram illustrating the structure of a substrate for a light emitting display panel having solvent vapor compensation reservoirs removed. In some embodiments, the solvent vapor compensation reservoir 112 is removed from the substrate 12 when a force is applied on the solvent vapor compensation reservoir 112. Referring to FIG. 3, by applying a force on the solvent vapor compensation reservoir 112, the solvent vapor compensation reservoir 112 is inevitably bent. For example, Point B is the bending point, the organic thin film around Point B may crack, which leads to particle contamination of a display panel. In order to solve this problem, further disclosures are provided as follows.

Referring to FIG. 2, in some embodiments, the connection layer 113 include an adhesive material layer. The adhesive material layer includes a thermally removable adhesive. The thermally removable adhesive may not be sticky in a high temperature according to different types of materials, different combinations and different fabricating methods of the thermally removable adhesive. In some embodiments, subsequent to the drying process, in the process of removing a solvent vapor compensation reservoir 112 is performed. Optionally, the solvent vapor compensation reservoir 112 may be removed from the substrate by heating the adhesive material layer at a heating temperature. Optionally, the heating temperature is in a range of approximately 80° C. to approximately 100° C., e.g., approximately 80° C. to approximately 85° C., approximately 85° C. to approximately 90° C., approximately 90° C. to approximately 95° C., and approximately 95° C. to approximately 100° C. The substrate 12 is heated thereby the thermally removable adhesive is heated. Therefore, the thermally removable adhesive becomes less or not sticky, and the connection layer 113 can no longer attached to the substrate 12 via the thermally removable adhesive, so, the solvent vapor compensation reservoir 112 can be easily removed from the substrate 12. Optionally, all parts of the solvent vapor compensation reservoir 112 can be removed as a whole, for example, by using manipulator with suction cup. Therefore, accidentally bending the solvent vapor compensation reservoir 112 can be avoided, obviating the problem of particle contamination of a display panel.

In some embodiments, the connection layer 113 includes adhesive material layer, and the adhesive material layer includes a magnetic particle-dispersed adhesive. During the removing process, a magnetic field is applied to the adhesive material layer, when the magnetic attraction force applied on the adhesive material layer is larger than the adhesion between the adhesive material layer and the substrate 12, the adhesive material layer as well as the solvent vapor compensation reservoir 112 are removed from the substrate 12. Optionally, all parts of the solvent vapor compensation reservoir 112 can be removed as a whole, for example, by using a manipulator with suction cup. Therefore, accidentally bending the solvent vapor compensation reservoir 112 can be avoided, obviating the problem of particle contamination of a display panel.

Various appropriate materials may be used for making the magnetic particle-dispersed adhesive. Examples of materials suitable for making the magnetic particle-dispersed adhesive include, but not limited to, metals having magnetic property such as iron, and compounds having magnetic property such as $Fe_3O_4$ and NdFeB.

In some embodiments, the connection layer 113 includes adhesive material layer, and the adhesive material layer includes a gecko biomimetic adhesive. The gecko biomimetic adhesive has the property that after the gecko biomimetic adhesive attached to a surface, a first force along a direction perpendicular to the substrate 12 and a second force along a direction parallel to the substrate 12 should be apply to the connection layer 113 to remove the solvent vapor compensation reservoir 112 from the substrate 12.

Various appropriate materials may be used for making the gecko biomimetic adhesive. Examples of materials suitable for making the gecko biomimetic adhesive include, but not limited to, poydimethylsiloxane, carbon nanotube, silicone rubber, and polyester resin. Various appropriate methods may be used for making the adhesive material layer including the gecko biomimetic adhesive. Examples of methods suitable for making the adhesive material layer including the gecko biomimetic adhesive include, but not limited to, the method of nano-engraving, the method of self-organized micro-nanoporous film casting, and the method of oriented self-assembly.

In one example, the solvent vapor compensation reservoir 112 is removably attached to the substrate 12 via the connection layer 113 including the gecko biomimetic adhesive. In the process of removing the solvent vapor compensation reservoir 112, a manipulator with suction cup is used to apply the first force along a direction perpendicular to the substrate 12 and a second force along a direction parallel to the substrate 12 to the solvent vapor compensation reservoir 112, therefore, the solvent vapor compensation reservoir 112 is detached from the substrate 12 and removed by the manipulator with suction cup. Optionally, all parts of the solvent vapor compensation reservoir 112 can be removed as a whole. Therefore, accidentally bending the solvent vapor compensation reservoir 112 will not happen, which obviates the problem of particle contamination of a display panel.

In some embodiments, each of the one or more ink droplet receiving grooves has an aperture having a size substantially same as a size of each of the plurality of subpixel apertures. Optionally, the one or more ink droplet receiving grooves 114 are arranged in a matrix. Optionally, the one or more ink droplet receiving grooves 114 are arranged in a repeating pattern having a first pitch, the plurality of subpixel apertures 121 are arranged in a repeating pattern having a second pitch, and the first pitch and the second pitch are substantially same. Optionally, the one or more ink droplet receiving grooves 114 are arranged in a first repeating pattern, the plurality of subpixel apertures 121 are arranged in a second repeating pattern, and the first repeating pattern and the second repeating patent are substantially same. Optionally, the size of each of the one or more ink droplet receiving grooves, the first pitch, the first repeating pattern can be adjusted as needed.

This disclosure also provides a method of fabricating a light emitting display panel including providing a solvent vapor compensating reservoir having one or more ink droplet receiving grooves; providing a substrate having a display area and a peripheral area, the substrate comprising a pixel definition layer for defining a plurality of subpixel apertures in the display area; attaching a solvent vapor compensation reservoir to the peripheral area of the substrate, the solvent vapor compensation reservoir comprising one or more ink droplet receiving grooves configured to receive an ink droplet and a connection layer, the solvent vapor compensation reservoir removably attached to the peripheral area of the substrate through the connection layer; dispensing ink droplets into the plurality of subpixel apertures and the one or more ink droplet receiving grooves; drying the ink droplets dispensed into the plurality of subpixel apertures and the one or more ink droplet receiving grooves; and removing the solvent vapor compensation reservoir from the substrate. The method according to the present disclosure can not only make sure that solvent evaporation rate of the ink droplets in the edge portion of the display area is substantially same as the solvent evaporation rate of the ink droplets in the central portion of the display area, but also be used in fabricating narrow frame display panel.

The solvent vapor compensation reservoir includes a groove layer having one or more ink droplet receiving grooves configured to receive an ink droplet. Various appropriate materials and various appropriate fabricating methods may be used for making the groove layer. Examples of material suitable for making the groove layer include, but not limited to, resins, plastics, and rubber. Examples of fabricating method for making the groove layer include, but not limited to, three-dimensional printing, printing, molding, and photolithography.

Figure 4A:
FIG. 4A to FIG. 4H are schematic diagrams illustrating a method of fabricating a substrate for a light emitting display panel.
Figure 4B:
Figure 4C:
Figure 4D:
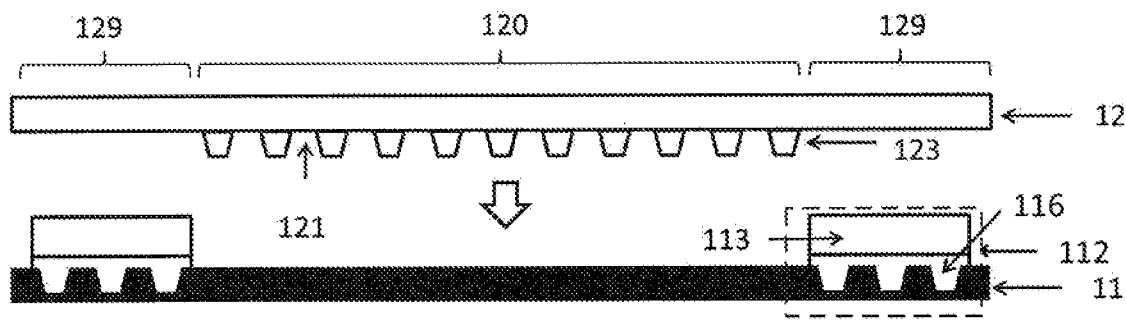
Figure 4E:
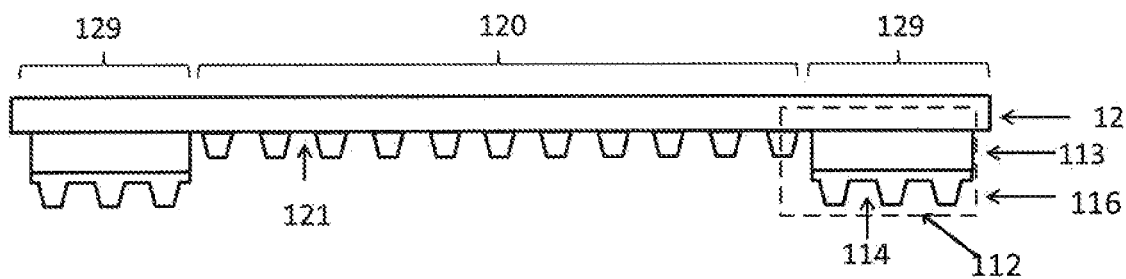
Figure 4F:
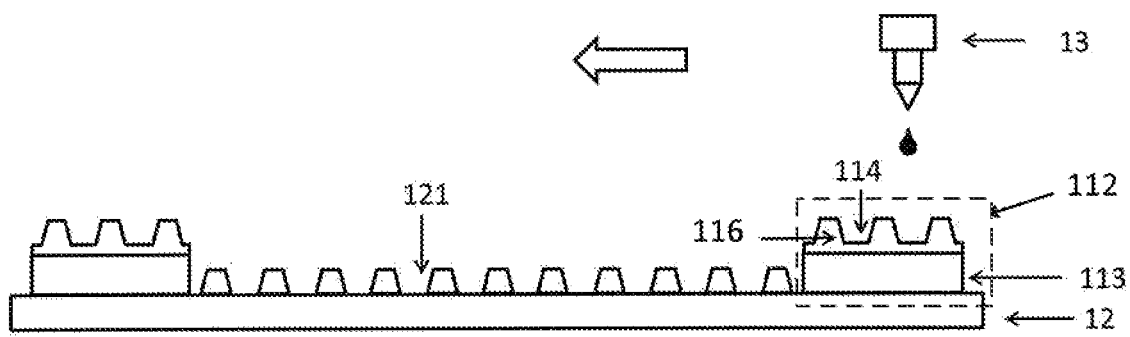
Figure 4G:
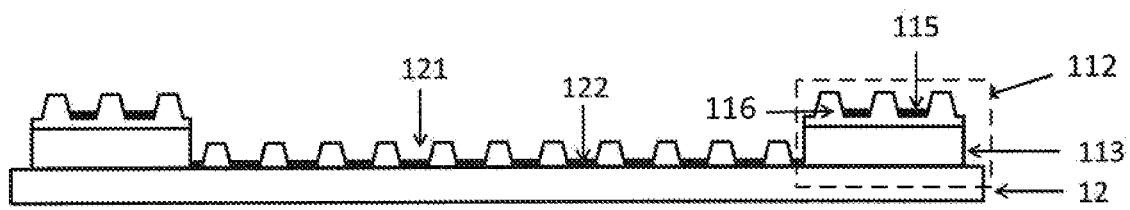
Figure 4H:
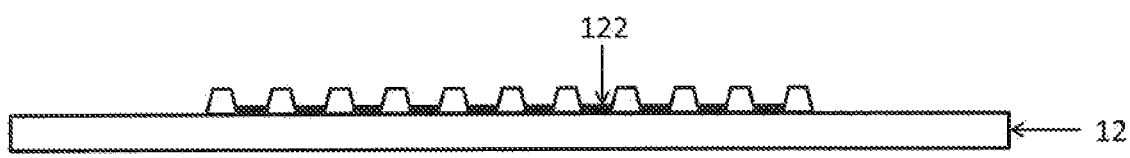

FIG. 4A to FIG. 4H are schematic diagrams illustrating a method of fabricating a substrate for a light emitting display panel. Referring to FIG. 4A, a method of fabricating a substrate for a light emitting display panel includes providing a molding substrate 11. Optionally, the molding substrate 11 is formed by glass. Optionally, the molding substrate 11 has one or more grooves 111. Referring to FIG. 4B, the method of fabricating a substrate for a light emitting display panel further includes filing the one or more grooves 111 with a molding material, and curing the molding material filled in the one or more grooves 111, therefore, forming the groove layer 116. Referring to FIG. 4C, the method of fabricating a substrate for a light emitting display panel further includes applying an adhesive material on a side of the groove layer 116 distal to the molding substrate 11 to form an adhesive layer of a connection layer 113 of a solvent vapor compensation reservoir 112. Referring to FIG. 4D, the method of fabricating a substrate for a light emitting display panel further includes providing a substrate 12. The substrate 12 has a display area 120 and a peripheral area 129. The substrate 12 includes a pixel definition layer 123 for defining a plurality of subpixel apertures 121 in the display area 120. Optionally, each of the plurality of subpixel aperture 121 is respectively corresponding to each subpixel on the substrate 12. Optionally, a side of the substrate having the pixel definition layer 123 12 and a side of the molding substrate 11 having one or more grooves 111 face each other. Subsequently, the connection layer 113 is adhered onto the peripheral area 129 of the substrate 12. Referring to FIG. 4E, the method of fabricating a substrate for a light emitting display panel further includes separating the solvent vapor compensation reservoir 112 from the molding substrate 11, thereby forming the one or more ink droplet receiving grooves 114. The shape of the one or more ink droplet receiving grooves 114 is complementary to the shape of the one or more grooves 111 on the molding substrate 11. Referring to FIG. 4F, the method of fabricating a substrate for a light emitting display panel further includes having a side having the plurality of subpixel apertures 121 of the pixel definition layer 123 facing an inkjet nozzle during the inkjet printing process. Therefore, ink droplets are dispensed in each of the plurality of subpixel apertures 121 and each of the one or more ink droplet receiving grooves 114. Referring to FIG. 4G, the method of fabricating a substrate for a light emitting display panel further includes drying the ink droplets dispensed into the plurality of subpixel apertures 121 and the one or more ink droplet receiving grooves 114. The solvent of the ink droplets is volatilized, therefore, a first organic thin film 122 are formed in the plurality of subpixel apertures 121, and a second organic thin film 115 are formed in the one or more ink droplet receiving grooves 114. Referring to FIG. 4H, the method of fabricating a substrate for alight emitting display panel further includes removing the solvent vapor compensation reservoir 112 from the substrate 12.

In some embodiments, in the molding process, the groove layer 116 of the solvent vapor compensation reservoir 112 is formed by resin. Optionally, the molding substrate 11 is aligned to the substrate 12, therefore, the solvent vapor compensation reservoir 112 is aligned to the peripheral area 129. The method of forming the solvent vapor compensation reservoir 112 and the method of aligning the solvent vapor compensation reservoir 112 to the peripheral area 129 are compatible with the fabricating method of display panels, so that no extra equipment is needed to perform the above processes, which can reduce the cost for fabricating display panels herein. Optionally, material excepting resin may be used to form the groove layer 116 of the solvent vapor compensation reservoir 112.

In some embodiments, in order to easily separate the solvent vapor compensation reservoir 112 from the molding substrate 11, before filing the one or more grooves 111 of the molding substrate 11 with a molding material (e.g. resin), release agents are applied to each of the one or more grooves 111.

In some embodiments, in order to remove the solvent vapor compensation reservoir 112 from the substrate 12, a force is applied to the solvent vapor compensation reservoir 112, thereby the solvent vapor compensation reservoir 112 is tore away from the substrate 12.

In some embodiments, in the process of applying an adhesive material on the groove layer 116 to form the adhesive layer of the connection layer 113 of the solvent vapor compensation reservoir 112, optionally, the adhesive material is a thermally removable adhesive. Subsequently, in the process of removing the solvent vapor compensation reservoir 112 from the substrate 12, the thermally removable adhesive is heated to lose stickiness. Therefore, all parts of the solvent vapor compensation reservoir 112 is easily removed as a whole by suction device, e.g. a manipulator with suction cup. Optionally, the adhesive layer of the connection layer 113 includes a magnetic particle-dispersed adhesive. Subsequently, in the process of removing the solvent vapor compensation reservoir 112 from the substrate 12, a magnetic field is applied to the connection layer 113 to remove the connection layer 113 from the substrate 12. Therefore, all parts of the solvent vapor compensation reservoir 112 is easily removed as a whole by suction device, e.g. a manipulator with suction cup. Optionally, the adhesive layer of the connection layer 113 includes a gecko biomimetic adhesive. Subsequently, in the process of removing the solvent vapor compensation reservoir 112 from the substrate 12, a first force along a direction perpendicular to the substrate 12 and a second force along a direction parallel to the substrate 12 are apply to the connection layer 113 to remove the solvent vapor compensation reservoir 112 from the substrate 12. Therefore, all parts of the solvent vapor compensation reservoir 112 is easily removed as a whole by suction device, e.g. a manipulator with suction cup.

Figure 5:
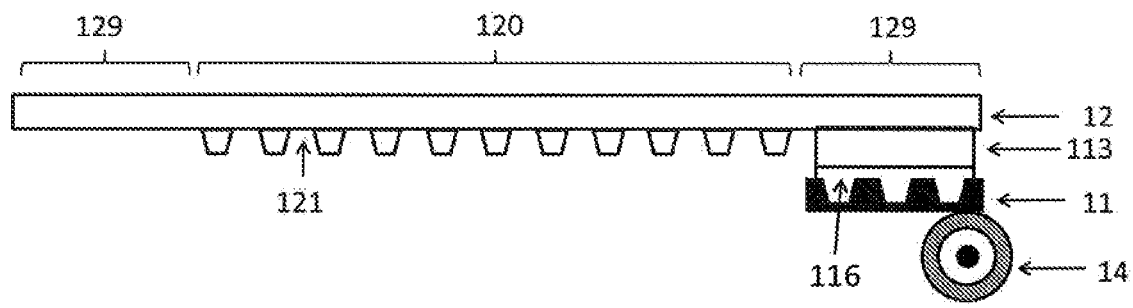
FIG. 5 is a schematic diagram illustrating a method of fabricating a substrate for a light emitting display panel.

In some embodiments, in the process of providing the molding substrate 11, the molding substrate 11 is made of rigid materials such as glass. Optionally, the molding substrate 11 is made of flexible materials such as plastic. In one example, since the molding substrate 11 is made of a flexible material, the shape of the molding substrate can be made as a strip. Referring to FIG. 5 which is a schematic diagram illustrating a method of fabricating a substrate for a light emitting display panel, subsequent to align the molding substrate 11 to the substrate 12, a wheel 14 is used to push the molding substrate 11 to the substrate 12, therefore, the molding substrate 11 is attached to the substrate 12. In another example, 4 strips of molding substrates 11 are respective prepared to fit the four sides of the peripheral area 129 of the substrate 12. The wheel 14 is used to respectively attach the 4 strips of molding substrates 11 to the four sides of the peripheral area 129 of the substrate 12.

Figure 6:
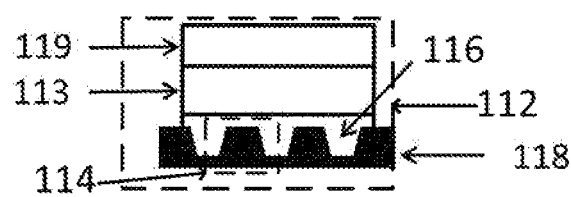
FIG. 6 is a schematic diagram illustrating the structure of a solvent vapor compensation reservoir.

This disclosure also provides a solvent vapor compensation reservoir for fabricating a substrate for a light emitting display panel. FIG. 6 is a schematic diagram illustrating the structure of a solvent vapor compensation reservoir. Referring to FIG. 6, a solvent vapor compensation reservoir 112 includes a groove layer 116 having one or more ink droplet receiving grooves 114 configured to receive an ink droplet on a first side, and a connection layer 113 on a second side of the connection layer 113 opposite to the first side. Optionally, the connection layer 113 is configured to be removably attached to the peripheral area of the substrate. Optionally, the connection layer 113 include an adhesive material layer. Optionally, the solvent vapor compensation reservoir 112 further includes a solvent vapor compensation reservoir protection layer 118 on the first side of the groove layer. The solvent vapor compensation reservoir protection layer 118 is configured to protect the one or more ink droplet receiving grooves 114 of the solvent vapor compensation reservoir 112. Optionally, the solvent vapor compensation reservoir 112 further includes a connection protection layer 119 on a side of the connection layer 113 distal to the grooves layer 116. The connection protection layer 119 is configured to prevent the connection layer 113 from attaching to other items. Optionally, release agents are disposed between the groove layer 116 and the solvent vapor compensation reservoir protection layer 118. With the release agents, the grooves layer 116 is easily removed from the solvent vapor compensation reservoir protection layer 118, so that the one or more ink droplet receiving grooves 114 are easily exposed.

The process of fabricating a substrate for a light emitting display panel includes aligning the solvent vapor compensation reservoir 112 to the peripheral area of the substrate; removing the connection protection layer 119 from the solvent vapor compensation reservoir 112; attaching the connection layer 113 to the peripheral area of the substrate; and removing the solvent vapor compensation reservoir protection layer 118 from the solvent vapor compensation reservoir 112. Therefore, the solvent vapor compensation reservoir 112 is disposed on the peripheral area of the substrate. Optionally, the connection layer 113 includes an adhesive material layer. Optionally, the adhesive material layer includes a thermally removable adhesive. Optionally, the adhesive material layer includes a magnetic particle-dispersed adhesive. Optionally, the adhesive material layer includes gecko biomimetic adhesive. Optionally, the molding substrate is made of rigid materials such as glass. Optionally, the solvent vapor compensation reservoir protection layer 118 is made of flexible material such as plastic. Optionally, the solvent vapor compensation reservoir protection layer 118 includes one or more grooves, the shape of one or more ink droplet receiving grooves 114 is complementary to the shape of the one or more grooves on the solvent vapor compensation reservoir protection layer 118. Optionally, solvent vapor compensation reservoir protection layer 118 can be the molding substrate 11 in FIG. 4A.

Figure 7A:
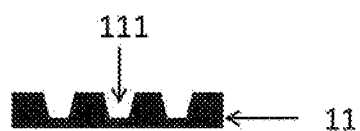
FIG. 7A to FIG. 7D are schematic diagrams illustrating a method of fabricating a solvent vapor compensation reservoir.
Figure 7B:
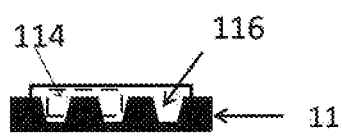
Figure 7C:
Figure 7D:
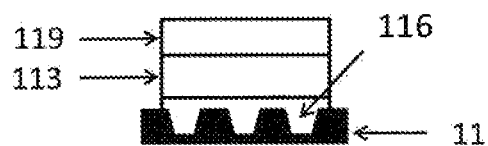

This disclosure also provides fabricating method of a solvent vapor compensation reservoir for fabricating a substrate for a light emitting display panel. FIG. 7A to FIG. 7D are schematic diagrams illustrating a method of fabricating a solvent vapor compensation reservoir. Referring to FIG. 7A, the method of fabricating a solvent vapor compensation reservoir includes providing a molding substrate 11 having one or more grooves 111. Referring to FIG. 7B, the method of fabricating a solvent vapor compensation reservoir further includes filing the molding substrate 11 with a molding material (e.g. resin), and curing the molding material filled in the one or more grooves 111 thereby forming the groove layer 116. Optionally, the groove layer 116 has one or more ink droplet receiving grooves 114. Optionally, the shape of the one or more ink droplet receiving grooves 114 is complementary to the shape of the one or more grooves on molding substrate 11. Referring to FIG. 7C, the method of fabricating a solvent vapor compensation reservoir further includes forming a connection layer 113 on a side of the groove layer 116 distal to the molding substrate 11. The connection layer 113 is configured to removably attached to the peripheral area of the substrate. Optionally, the connection layer 113 includes an adhesive material layer. Referring to FIG. 7D, the method of fabricating a solvent vapor compensation reservoir further includes forming a connection protection layer 119 on a side of the connection layer 113 distal to the grooving layer 116. The connection protection layer 119 is configured to prevent the connection layer 113 from attaching to other items. In some embodiments, the molding substrate 11 is a solvent vapor compensation reservoir protection layer configured to protect the one or more ink droplet receiving grooves 114. Optionally, release agents are disposed between the groove layer 116 and the solvent vapor compensation reservoir protection layer. With the release agents, the grooves layer 116 is easily removed from the solvent vapor compensation reservoir protection layer, so that the one or more ink droplet receiving grooves 114 are easily exposed. Optionally, the connection layer 113 includes an adhesive material layer. Optionally, the adhesive material layer includes a thermally removable adhesive. Optionally, the adhesive material layer includes a magnetic particle-dispersed adhesive. Optionally, the adhesive material layer includes gecko biomimetic adhesive. Optionally, the solvent vapor compensation reservoir protection layer is made of rigid materials such as glass. Optionally, the solvent vapor compensation reservoir protection layer is made of flexible material such as plastic. Optionally, the shape of one or more ink droplet receiving grooves 114 is complementary to the shape of the one or more grooves 111 on the solvent vapor compensation reservoir protection layer.

This disclosure also provides a display panel including the substrate herein. Optionally, the display panel is an OLED display panel. Optionally, the display panel is a quantum dots display panel.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a light emitting display panel, comprising:
   providing a substrate having a display area and a peripheral area, the substrate comprising a pixel definition layer for defining a plurality of subpixel apertures for a light emitting layer in the display area;
   attaching a solvent vapor compensation reservoir to the peripheral area of the substrate, the solvent vapor compensation reservoir comprising one or more ink droplet receiving grooves configured to receive an ink droplet and a connection layer, the solvent vapor compensation reservoir removably attached to the peripheral area of the substrate through the connection layer;
   dispensing ink droplets into the plurality of subpixel apertures and the one or more ink droplet receiving grooves;
   drying the ink droplets dispensed into the plurality of subpixel apertures and the one or more ink droplet receiving grooves; and
   removing the solvent vapor compensation reservoir from the substrate.

2. The method of claim 1, wherein the connection layer comprises an adhesive material layer.

3. The method of claim 2, wherein the adhesive material layer comprises one or a combination of a thermally removable adhesive, a magnetic particle-dispersed adhesive, and a gecko biomimetic adhesive.

4. The method of claim 2, prior to attaching the solvent vapor compensation reservoir to the peripheral area of the substrate, further comprising:
   providing a molding substrate having one or more grooves;
   filling the one or more grooves with a molding material and curing the molding material filled in the one or more grooves, thereby forming a solvent vapor compensation reservoir having one or more ink droplet receiving grooves;
   forming a connection layer on the solvent vapor compensation reservoir;
   adhering the connection layer onto the peripheral area of the substrate; and
   separating the solvent vapor compensation reservoir from the molding substrate, thereby attaching the solvent vapor compensation reservoir to the peripheral area of the substrate.

5. The method of claim 2, wherein the connection layer comprises an adhesive material layer including a thermally removable adhesive;
   wherein removing the solvent vapor compensation reservoir from the substrate comprises heating the adhesive material layer.

6. The method of claim 2, wherein the connection layer comprises an adhesive material layer including a magnetic particle-dispersed adhesive;
   wherein removing the solvent vapor compensation reservoir from the substrate comprises applying a magnetic field to the adhesive material layer.

7. The method of claim 2, wherein the connection layer comprises a gecko biomimetic adhesive;
   wherein removing the solvent vapor compensation reservoir from the substrate comprises applying a first force to the connection layer along a direction perpendicular to the substrate; and
   applying a second force to the connection layer along a direction parallel to the substrate.

8. The method of claim 1, wherein a depth of each of one or more ink droplet receiving grooves equals to the depth of each of the plurality of subpixels apertures in the display area.

9. The method of claim 1, wherein a depth of each of one or more ink droplet receiving grooves is greater than the depth of each of the plurality of subpixels apertures in the display area.

10. The method of claim 1, wherein each of one or more ink droplet receiving grooves extends through the solvent vapor compensation reservoir; and
    the connection layer constitutes a bottom surface for each of the one or more ink droplet receiving grooves.

11. A light emitting display panel, fabricated by the method of claim 1.

* * * * *